United States Patent
Momose (10) Patent No.: US 10,410,953 B2
(45) Date of Patent: Sep. 10, 2019

(54) POWER CONVERSION DEVICE INCLUDING SEMICONDUCTOR MODULE PROVIDED WITH LAMINATED STRUCTURE

(71) Applicant: DENSO CORPORATION, Kariya, Aichi-pref. (JP)

(72) Inventor: Taijiro Momose, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/654,858

(22) Filed: Jul. 20, 2017

(65) Prior Publication Data

US 2018/0025961 A1 Jan. 25, 2018

(30) Foreign Application Priority Data

Jul. 21, 2016 (JP) .................. 2016-143338

(51) Int. Cl.
*H01L 23/42* (2006.01)
*H01L 23/28* (2006.01)
*H01L 23/488* (2006.01)
*H01L 23/367* (2006.01)
*H01L 25/07* (2006.01)

(52) U.S. Cl.
CPC .............. *H01L 23/42* (2013.01); *H01L 23/28* (2013.01); *H01L 23/3675* (2013.01); *H01L 23/488* (2013.01); *H01L 25/072* (2013.01)

(58) Field of Classification Search
CPC ....... H01L 23/42; H01L 23/28; H01L 23/488; H01L 23/3675; H01L 25/072
See application file for complete search history.

(56) References Cited

U.S. PATENT DOCUMENTS

| 9,888,596 B2* | 2/2018 | Momose .............. H05K 5/0239 |
| 2009/0201708 A1 | 8/2009 | Ohkouchi et al. |
| 2011/0194253 A1* | 8/2011 | Momose .............. H01L 23/467 361/697 |
| 2016/0073556 A1 | 3/2016 | Nakasaka |

FOREIGN PATENT DOCUMENTS

| JP | 2009-232564 A | 10/2009 |
| JP | 2010016402 A | 1/2010 |
| JP | 2014187118 A | 10/2014 |
| JP | 2015-136223 A | 7/2015 |

* cited by examiner

*Primary Examiner* — Mark V Prenty
(74) *Attorney, Agent, or Firm* — Oliff PLC (57) ABSTRACT

A power conversion device includes a semiconductor module with switching elements incorporated therein, a plurality of components electrically connected to the semiconductor module, and a laminated cooler provided with a plurality of cooling plates. A laminate is constituted by laminating at least the plurality of cooling plates and the semiconductor module, at least one among the plurality of cooling plates constituting the laminate is a large area cooling plate in which a projected area when viewed from the stacking direction is larger than the other cooling plates, and at least one of the components is a specific arrangement component which, when viewed from the stacking direction, is arranged in a specific position which overlaps the large area cooling plate, and, when viewed from a direction orthogonal to the stacking direction, overlaps with the laminate.

12 Claims, 11 Drawing Sheets

POWER CONVERSION DEVICE INCLUDING SEMICONDUCTOR MODULE PROVIDED WITH LAMINATED STRUCTURE

CROSS-REFERENCE TO RELATED APPLICATION

This application is based on and claims the benefit of priority from earlier Japanese Patent Application No. 2016-143338 filed Jul. 21, 2016, the description of which is incorporated herein by reference.

BACKGROUND OF THE INVENTION

Technical Field

The present invention relates to a power conversion device.

Description of the Related Art

There are power conversion devices such as an inverter which is to be mounted in, for example, an electric vehicle or a hybrid vehicle, having a configuration in which a semiconductor module and a cooling plate are laminated. For example, JP-A 2010-16402 discloses that a capacitor which is a component electrically connected to the semiconductor module was also laminated with the semiconductor module and the cooling plate. By such a configuration, not only the semiconductor module, but the capacitor can also be cooled by the cooling plate.

However, in the case when the laminate is constructed by laminating a component such as a capacitor together with the semiconductor module and the cooling plate, it is considered that if the size in the stacking direction of the laminate becomes large, it becomes disadvantageous to vibration resistance. On the one hand, if a component is arranged offset from the laminate, the cooling of the component cannot be performed by the cooling plate.

SUMMARY

The present disclosure provides a power conversion device which is excellent in vibration resistance and which can perform cooling of the components.

An embodiment of the present disclosure is a power conversion device includes a semiconductor module incorporating switching elements, a plurality of components electrically connected to the aforementioned semiconductor module, and a laminated cooler provided with a plurality of cooling plates, a laminate constituted by laminating at least the aforementioned plurality of cooling plates and the aforementioned semiconductor module. At least one among the aforementioned plurality of cooling plates constituting the aforementioned laminate is a large area cooling plate in which a projected area when viewed from the stacking direction is larger than the aforementioned cooling plate, and at least one of the aforementioned components is a specific arrangement component which, when viewed from the aforementioned stacking direction, is arranged in a specific position which overlaps with the aforementioned large area cooling plate, and, when viewed from a direction orthogonal to the aforementioned stacking direction, overlaps with the aforementioned laminate.

In the aforementioned power conversion device, at least one of the aforementioned components is the aforementioned specific arrangement component. Therefore, the size in the stacking direction of the laminate can be suppressed, and the cooling of the aforementioned component by the large area cooling plate becomes possible.

Namely, at least one of the components is a specific arrangement component which is not a part of the laminate, thus, the size in the stacking direction of the laminate can be minimized compared to the case when the component was made as part of the laminate. As the result, the vibration resistance of the laminate can be improved.

Further, the specific arrangement component is arranged in the aforementioned specific position, thus, it is possible to directly or indirectly perform cooling by the large area cooling plate. Therefore, at least one of the components can be cooled without being incorporated into a part of the laminate.

As stated above, the aforementioned embodiment provides a power conversion device having excellent vibration resistance and which can perform cooling of a component.

Note that, the reference numerals in parentheses described in the claims and the means for solving the problems indicate the corresponding relationship of components between the specific means described in the following embodiments, and do not limit the technical range of the present invention.

DETAILED DESCRIPTION OF THE PREFERRED EMBODIMENTS

First Embodiment

The embodiment of the power conversion device will be explained with reference to FIGS. 1 to 4.

Figure 1:
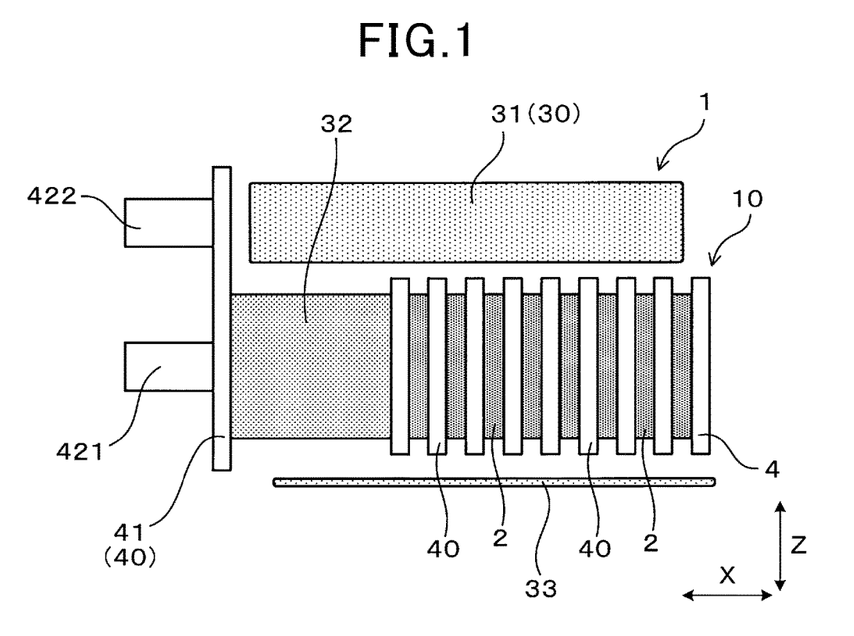
FIG. 1 is a side view of a power conversion device according to a first embodiment.
Figure 2:
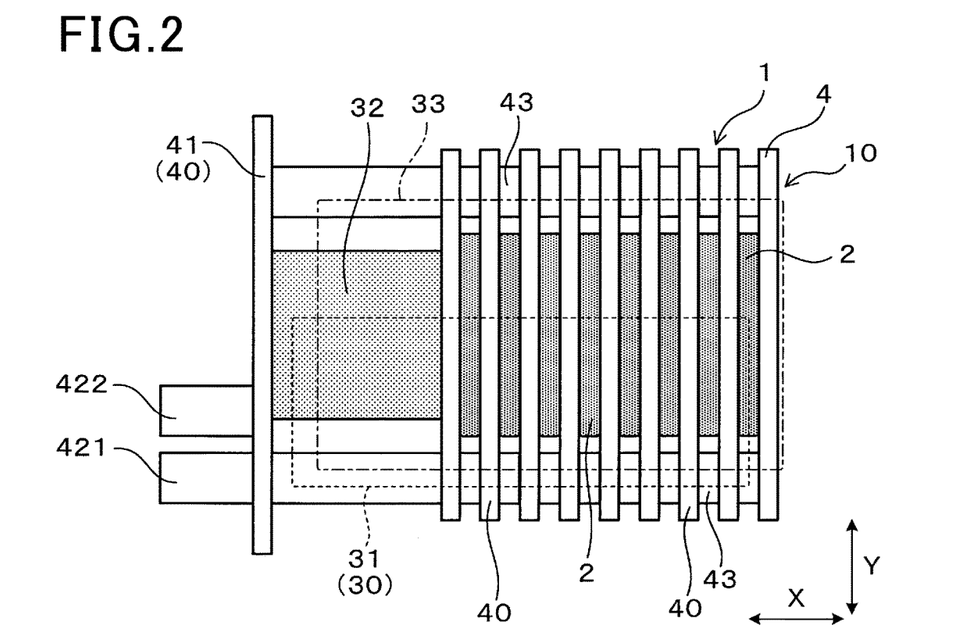
FIG. 2 is a plan view of the power conversion device according to the first embodiment.

The power conversion device 1 according to the first embodiment, as shown in FIGS. 1 and 2, includes a semiconductor module 2, a capacitor 31, a reactor 32, and a circuit board 33 which are components electrically connected to the semiconductor module 2, and a laminated cooler 4.

The semiconductor module 2 incorporates switching elements. The laminated cooler 4 includes a plurality of cooling plates 40. A laminate 10 is constituted by laminating at least a plurality of cooling plates 40 and the semiconductor module 2. At least one among the plurality of cooling plates 40 constituting the laminate 10 is a large area cooling plate 41 in which a projected area in the stacking direction X is larger than the other cooling plates 40.

In the embodiment, the capacitor 31 is a specific arrangement component 30 which is arranged in a specific position. The specific position refers to a position which, when viewed from the stacking direction X, overlaps with the large area cooling plate 41, and, when viewed from a direction orthogonal to the stacking direction X, overlaps with the laminate 10. Further, arranging in the specific position means that at least one part is arranged in a space corresponding to the specific position. Therefore, at least one part of the specific arrangement component 30, when viewed from the stacking direction X, overlaps with the large area cooling plate 41, and, when viewed from a direction orthogonal to the stacking direction X, overlaps with the laminate 10.

In the disclosure, the alignment direction of the laminate 10 and the specific arrangement component 30 which is the direction orthogonal to the stacking direction X is referred to as the height direction Z. Further, the direction orthogonal to both the height direction Z and the stacking direction X is referred to as the lateral direction Y. The capacitor 31 which is the specific arrangement component 30, when viewed from the stacking direction X, overlaps with the large area cooling plate 41, and when viewed from the height direction Z, overlaps with the laminate 10. In the embodiment, the capacitor 31, as shown in FIG. 3, when viewed from the stacking direction X, fits inside the contour of the large area cooling plate 41, and as shown in FIG. 2, when viewed from the height direction Z, fits in the contour of the laminate 10.

Further, in the embodiment, as shown in FIGS. 1 and 2, the laminate 10 is obtained by laminating a reactor 32 which is a component other than the specific arrangement component 30 with the cooling plate 40 and the semiconductor module 2.

Figure 3:
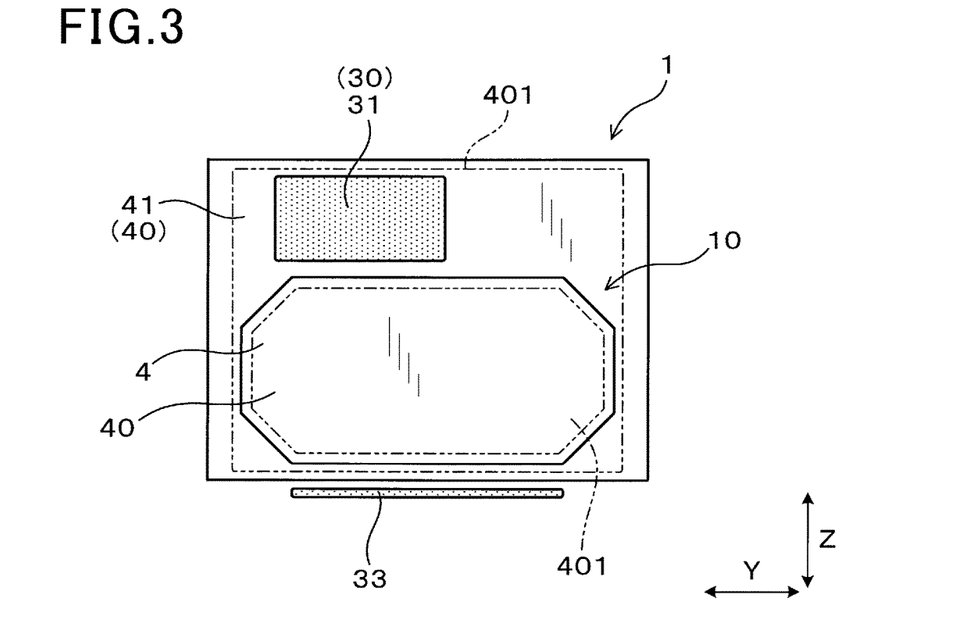
FIG. 3 is a front view of the power conversion device according to the first embodiment.

Further, as shown in FIGS. 1 and 3, the laminate 10 is arranged between two components in the height direction Z. Moreover, the capacitor 31 which is one of the two components becomes the specific arrangement component 30. Further, the other component among the two components arranged on the side opposite to each other and sandwiching the laminate 10 in the height direction Z is a circuit board 33 to which a signal terminal of the semiconductor module 2 is connected. Namely, the laminate 10 is arranged between the capacitor 31 and the circuit board 33 in the height direction Z.

The laminated cooler 4 is constituted so that the coolant passes through the inside. A coolant flow path is formed on the inside of each cooling plate 40. The coolant flow path in the cooling plate 40 other than the large area cooling plate 41 is formed along the lateral direction Y.

As shown in FIGS. 1 and 2, the large area cooling plate 41 is arranged at one end in the stacking direction X among the laminated coolers 4. Moreover, the large area cooling plate 41 is provided with a coolant introduction pipe 421 for introducing coolant to the laminated cooler 4, and a coolant discharge pipe 422 for discharging the coolant from the laminated cooler 4.

The reactor 32 is arranged between the large area cooling plate 41 and the adjacent cooling plate 40.

Regarding the plurality of cooling plates 40, the cooling plates 40 adjacent to each other in the stacking direction X are connected to each other by the connecting pipes 43 at both ends of the lateral direction Y. Moreover, the coolant introduction pipe 421 and the coolant discharge pipe 422 are connected to the large area cooling plate 41 arranged on one end of the stacking direction X. Therefore, the coolant introduced from the coolant introduction pipe 421 is branched and flows to the plurality of cooling plates 40, and is discharged from the coolant discharge pipe 422. Moreover, the semiconductor module 2, the reactor 32 and the coolant perform heat exchange while the coolant flows through the plurality of cooling plates 40. The semiconductor module 2 and the reactor 32 are cooled thereby. Further, the capacitor 31 is indirectly cooled by the coolant flowing through the large area cooling plate 41.

As shown in FIG. 3, the cooling plate 40 preferably has the coolant flow path 401 formed on the inside along almost the entirety thereof, when viewed in the stacking direction X. Specifically, the large area cooling plate 41, when viewed in the stacking direction X, preferably has a coolant flow path 401 formed in the portion which overlaps with the semiconductor module 2, and in the portion which overlaps with the specific arrangement component 30. In this case, the reactor 32 which is the component incorporated in the laminate 10 and the capacitor 31 which is the specific arrangement component 30 can be cooled more efficiently. Note that, a description of the coolant flow path 401 has been omitted in the drawings other than FIG. 3.

However, the cooling plate 40 may have a portion in which the coolant flow path has not been formed. For example, the large area cooling plate 41 may be constituted by a coolant flow path provided in a position facing the reactor 32, or which is not provided in a position facing the capacitor 31. With respect thereto, from the viewpoint of the cooling performance of the capacitor 31 which is the specific arrangement component 30, as stated above, the coolant flow path 401 in the large area cooling plate 41 is preferably constituted so as to be provided in a position facing the reactor 32 and in a position facing the capacitor 31.

Further, the member constituting the laminated cooler 4 is a metal such as an aluminum alloy.

Figure 4:
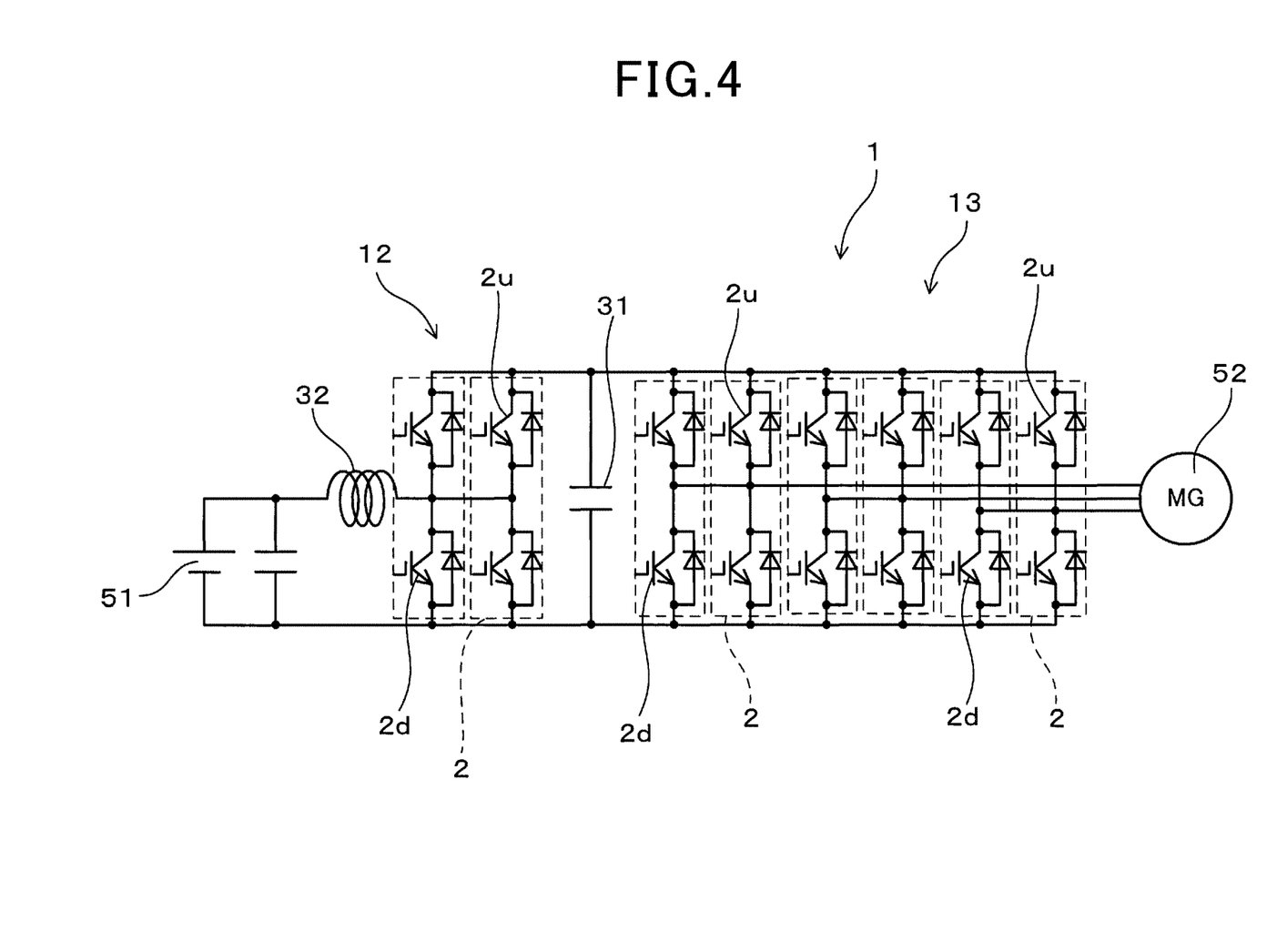
FIG. 4 is a circuit diagram of the power conversion device according to the first embodiment.

The power conversion device according to the first embodiment is constituted so as to perform power conversion, for example, between a DC power supply 51 and a three-phase AC rotary electric machine 52 as shown in FIG. 4. The power conversion device 1 has a booster circuit 12 and an inverter circuit 13. The booster circuit 12 is constituted by the reactor 32 and the semiconductor module 2, etc. The inverter circuit 13 is constituted by the semiconductor module 2, etc. The capacitor 31 functions as a smoothing capacitor. The power conversion device 1 is constituted so as to convert the DC power to three-phase AC power in order to drive a rotary electric machine 52. Further, the power generated in the rotary electric machine 52 can also be regenerated by converting to direct current in the inverter circuit 13.

Each semiconductor module 2 is incorporated with an upper arm switching element 2u and a lower arm switching element 2d as the switching elements.

The inverter circuit 13 is provided with a three phase legs obtained by connecting in series with the upper arm switching element 2u with the lower arm switching element 2d. Each switching element is composed of an IGBT, i.e., an insulated gate bipolar transistor. Further, flywheel diodes are respectively connected in an anti-parallel manner to the upper arm switching element 2u and the lower arm switching element 2d. The connection points of the upper arm switching element 2u and the lower arm switching element 2d in each leg are respectively connected to the three electrodes of the rotary electric machine 52. Note that, the switching elements are not limited to IGBTs, and, for example, MOSFETs, i.e., a MOS field effect transistors can be used.

In the embodiment, the upper arm switching element 2u and the lower arm switching element 2d constituting each phase in the inverter circuit 13 have a parallel configuration of the two respective switching elements. Further, one upper arm switching element 2u and one lower arm switching element 2d connected in series to each other are integrated in one semiconductor module 2.

The booster circuit 12 comprises two upper arm switching elements 2u connected in parallel to each other, and two lower arm switching elements 2d connected in parallel to each other. Moreover, the one upper arm switching element 2u and the one lower arm switching element 2d connected in parallel to each other are integrated in one semiconductor module 2.

Next, the function and effect of the embodiment will be explained.

A capacitor 31 which is one of the components in the aforementioned power conversion device 1 is the specific arrangement component 30. Therefore, the size of the stacking direction X of the laminate 10 can be suppressed, and the cooling of the capacitor 31 by the large area cooling plate 41 becomes possible.

Figure 5:
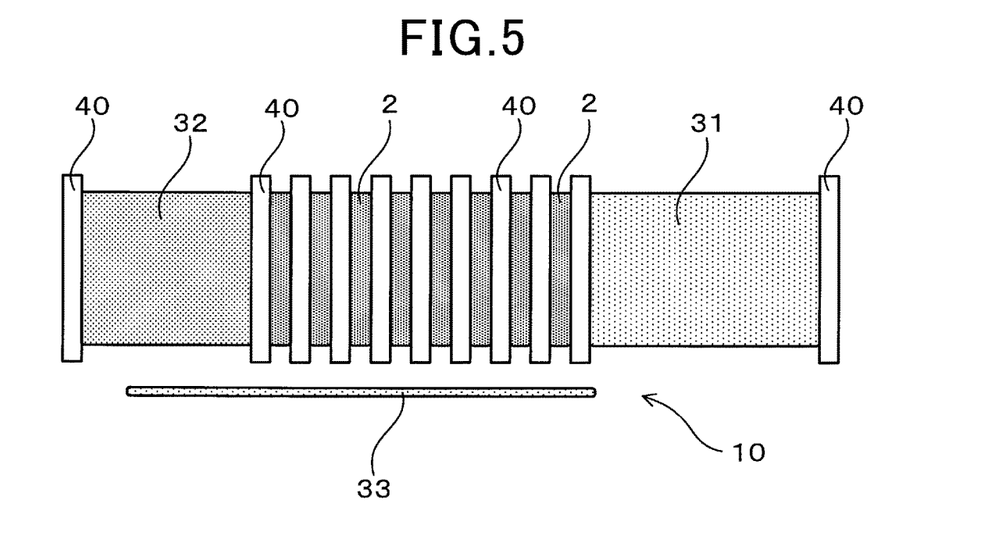
FIG. 5 is a side view of the power conversion device in which the capacitor and the reactor were incorporated into one part of the laminate.

Namely, shown in FIGS. 1 to 3, the capacitor 31 is the specific arrangement component 30 which is not a part of the laminate 10. Therefore, the size of the stacking direction X of the laminate 10 can be minimized compared to the case when the capacitor 31 is made as a part of the laminate 10 as shown in FIG. 5. As the result, the vibration resistance of the laminate 10 can be improved. Therefore, by suppressing the size in the stacking direction X of the laminate 10, it is advantageous from the viewpoint of the vibration resistance even if, for example, the power conversion device 1 is mounted in the transmission of a vehicle. Further, by suppressing the size of the stacking direction X, the resonance frequency can increase, and it becomes easy to prevent resonance with the engine.

Further, the capacitor 31 is arranged in the aforementioned specific position, thus, it becomes possible to directly or indirectly cool by the large area cooling plate 41.

Therefore, both the vibration resistance and the securement of cooling performance of the capacitor 31 can be ensured by arranging the capacitor 31 in the aforementioned specific position.

The laminate 10 is obtained by laminating the reactor 32 which is a component other than the specific arrangement component 30 with the cooling plate 40 and the semiconductor module 2. Therefore, when there are a plurality of components for which cooling is desired, the plurality of a components can be efficiently cooled while suppressing the size of the stacking direction X of the laminate 10 to the utmost.

Further, among the capacitor 31 and the reactor 32, the reactor 32 having a comparatively large heat quantity is incorporated in the laminate 10 and actively cooled, and the capacitor 31 having a comparatively small heat quantity is arranged in the aforementioned specific position. Namely, the reactor 32 used for boosting, as stated above, easily generates noise and has a heat quantity compared to the capacitor 31 which can absorb noise. The reactor 32 is incorporated in the laminate 10 and actively cooled. On the other hand, the capacitor 31 can be sufficiently cooled even by setting the special arrangement component 30 removed from the laminate 10. Therefore, it becomes easy to realize efficient cooling for the entirety of the power conversion device 1.

The laminate 10 is arranged between the capacitor 31 and the circuit board 33 which are two components in the height direction Z. Moreover, the capacitor 31 is the specific arrangement component 30. Therefore, the thermal interference between the circuit board 33 and the capacitor 31 can be suppressed while cooling the capacitor 31.

Further, the large area cooling plate 41 is arranged on one end in the stacking direction X among the laminated coolers 4. The space corresponding to the abovementioned specific position can become larger thereby. Therefore, the specific arrangement component 30 is easily arranged in the specific position, and the enlargement of the power conversion device 1 can be suppressed.

Further, the coolant introduction pipe 421 and the coolant discharge pipe 422 are provided in the large area cooling plate 41. Therefore, the degree of freedom of the arrangement of the coolant introduction pipe 421 and the coolant discharge pipe 422 can be increased.

As stated above, the aforementioned embodiment provides a power conversion device having an excellent vibration resistance and which can perform cooling of a component.

Second Embodiment

Figure 6:
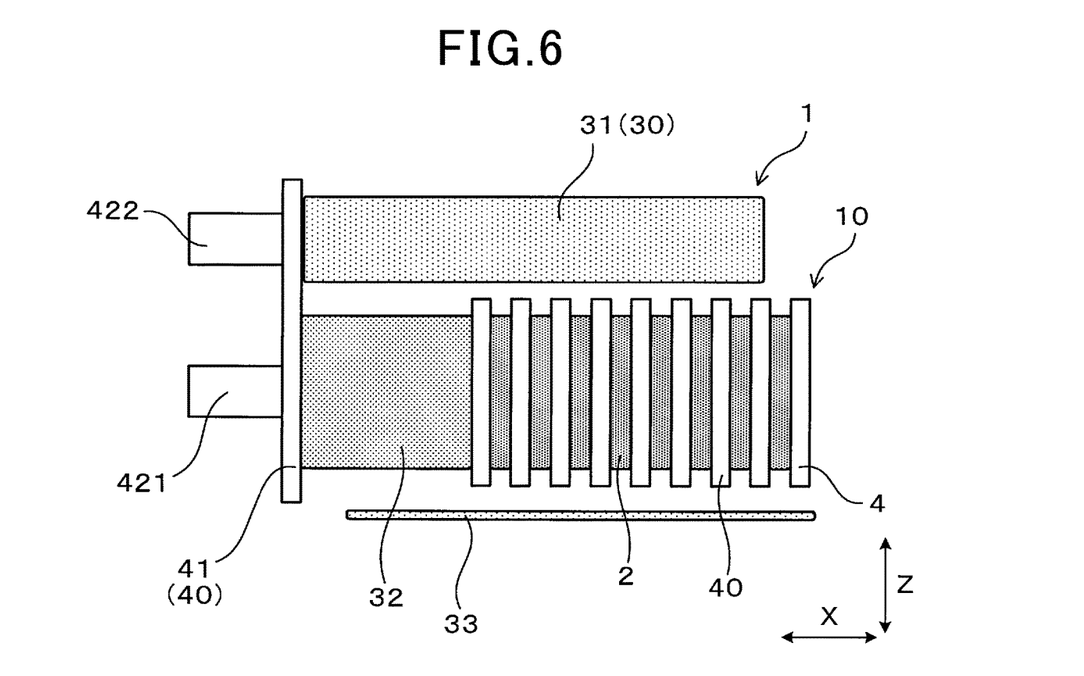
FIG. 6 is a side view of a power conversion device according to a second embodiment.

The second embodiment is a configuration, as shown in FIG. 6, in which the capacitor 31 which is the specific arrangement component 30 is in surface contact with the large area cooling plate 41.

Namely, the capacitor 31 is in surface contact with the large area cooling plate 41 from the one end of the stacking direction X. The capacitor 31 and the large area cooling plate 41 may be in direct surface contact or may be in surface contact via a heat transfer member such as a heat radiation sheet.

The other configurations are the same as the first embodiment.

Note that, among the reference numerals used in the second embodiment, the same reference numerals used in the previous embodiment, unless specifically indicated, refer to the same compositional elements as in the previous embodiment.

In the present embodiment, the capacitor 31 can be cooled more efficiently.

In addition, the second embodiment has the same operational effect as the first embodiment.

Third Embodiment

Figure 7:
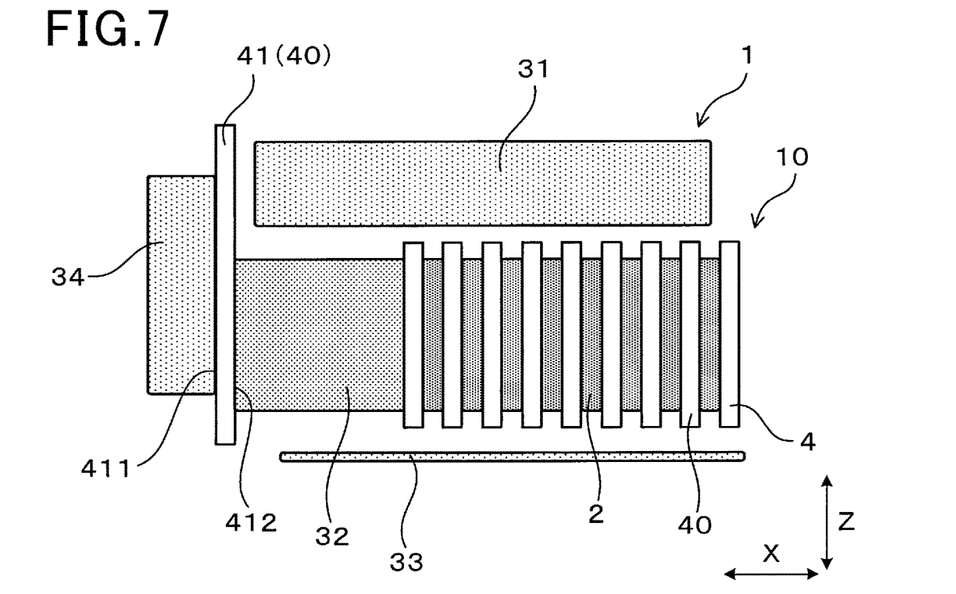
FIG. 7 is a side view of the power conversion device according to a third embodiment.

In the third embodiment, as shown in FIG. 7, at least one component is respectively arranged facing both surfaces in the stacking direction X in the large area cooling plate 41. Namely, in the embodiment, a DC-DC converter 34 is arranged in a first face 411 which is a face on a side opposite to the semiconductor module 2 side in the large area cooling plate 41. Further, the reactor 32 is arranged in a second face 412 which is a face on a side opposite to the first face 411 in the large area cooling plate 41. Furthermore, the capacitor 31 which is the specific arrangement component 30 is also arranged facing the second face 412 of the large area cooling plate 41.

The DC-DC converter 34 is provided with, for example, a transformer, a switching element, etc., and is constituted so as to covert high voltage DC power to low voltage DC power.

FIG. 7 shows a configuration in which the capacitor 31 is arranged facing the large area cooling plate 41 and is provided with a space therebetween, but the capacitor 31 may be in surface contact with the large area cooling plate 41. Further, FIG. 7 shows a configuration in which the DC-DC converter 34 is in surface contact with the large area cooling plate 41, but the DC-DC converter 34 may be arranged facing the large area cooling plate 41 and a space may be provided between the DC-DC converter 34 and the large area cooling plate 41. Further, the coolant introduction pipe 421 and the coolant discharge pipe 422 are omitted in FIG. 7, but the coolant introduction pipe 421 and the coolant discharge pipe 422 can be arranged appropriately at an appropriate position in the laminated cooler 4. The other configurations details are the same as in the first embodiment.

In the present embodiment, the DC-DC converter 34 can also be cooled by the large area cooling plate 41. Therefore, it is possible to perform efficient cooling in a power conversion device 1 also provided with DC-DC converter 34.

In addition, the third embodiment has the same operational effect as the first embodiment.

Fourth Embodiment

Figure 8:
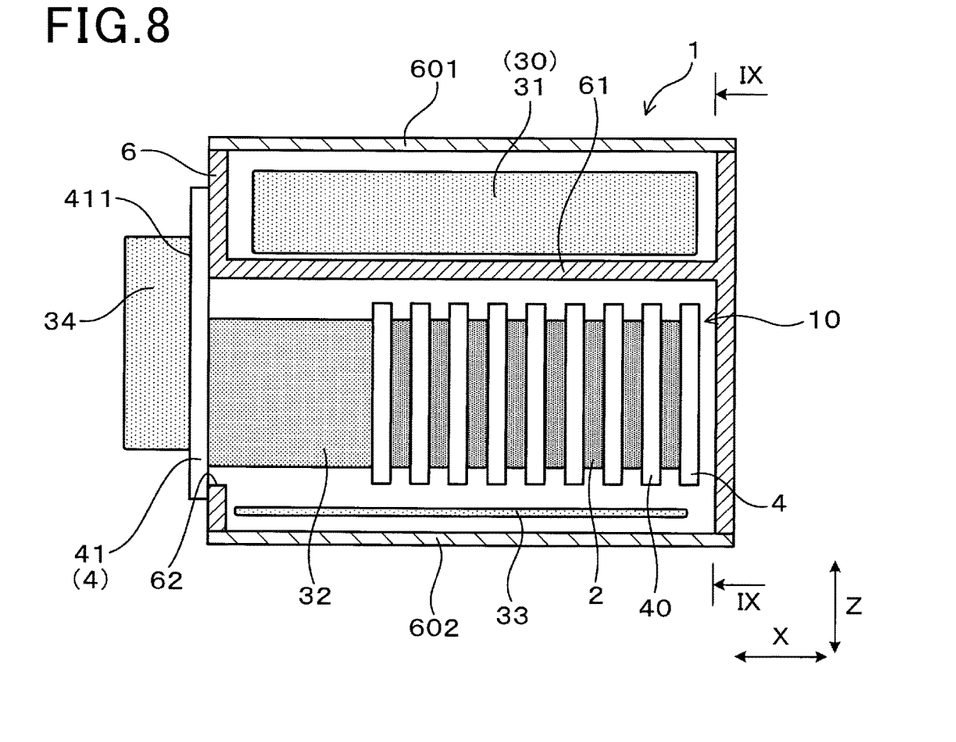
FIG. 8 is a side view of the power conversion device according to a fourth embodiment.
Figure 9:
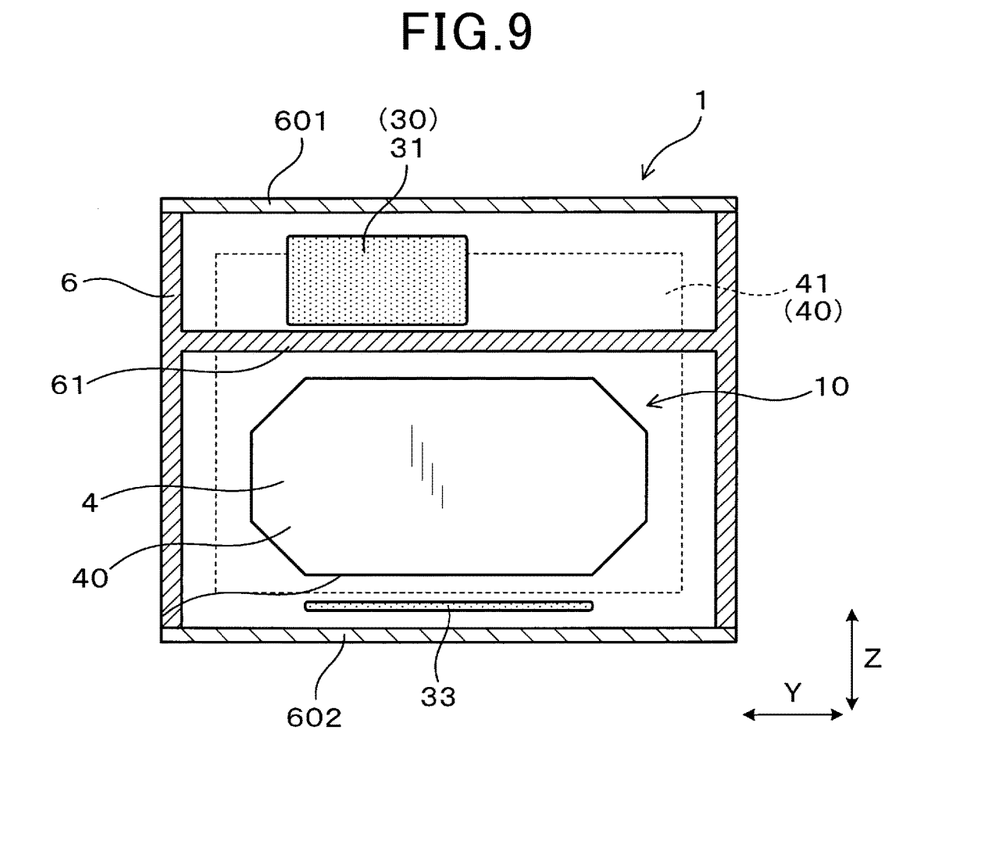
FIG. 9 is a sectional arrow cross-sectional view taken across line IX-IX of FIG. 8.

The fourth embodiment, as shown in FIGS. 8 and 9, is a power conversion device 1 constituted so that the heat of the specific arrangement component 30 can be radiated to the large area cooling plate 41 via the case 6.

Namely, the power conversion device 1 is provided with a metal case 6 which houses the semiconductor module 2, the capacitor 31 and the laminated cooler 4. The large area cooling plate 41 is in contact with the case 6. Moreover, the capacitor 31 which is the specific arrangement component 30 is assembled in the case 6.

The case 6 has the capacitor 31 and an intermediate wall section 61 which is arranged between the reactor 32 and the laminate 10. Moreover, the capacitor 31 is fixed to the intermediate wall section 61 by a bolt which is not shown. Both sides of the height direction Z of the case 6 are formed to an open surface. Moreover, lids 601,602 are attached to a pair of open surfaces so that the open surfaces can be closed.

Further, the case 6 is provided with an opening 62 in one side of the stacking direction X. The case 6 is constituted so that the laminate 10 can be inserted from the opening 62 into the case 6. Further, the large area cooling plate 41 is in contact with the outer surface of the case 6 so as to close the opening 62. Further, the DC-DC converter 34 is in surface contact with the first face 411 of the large area cooling plate 41. Namely, the DC-DC converter 34 is arranged outside of the case 6.

The other configurations are the same as the third embodiment.

In the case of the present embodiment, the heat of the capacitor 31 which is the specific arrangement component 30 can be radiated to the large area cooling plate 41 via the case 6. Therefore, the heat of the specific arrangement component 30 can be efficiently radiated. Further, the degrees of freedom of the arrangement of the specific arrangement component 30 can be improved. Further, the intermediate wall section 61 is arranged between the capacitor 31 and the semiconductor module 2, and thus, can suppress thermal interference between the capacitor 31 and the semiconductor module 2.

In addition, the fourth embodiment has the same operational effect as the third embodiment.

Fifth Embodiment

Figure 10:
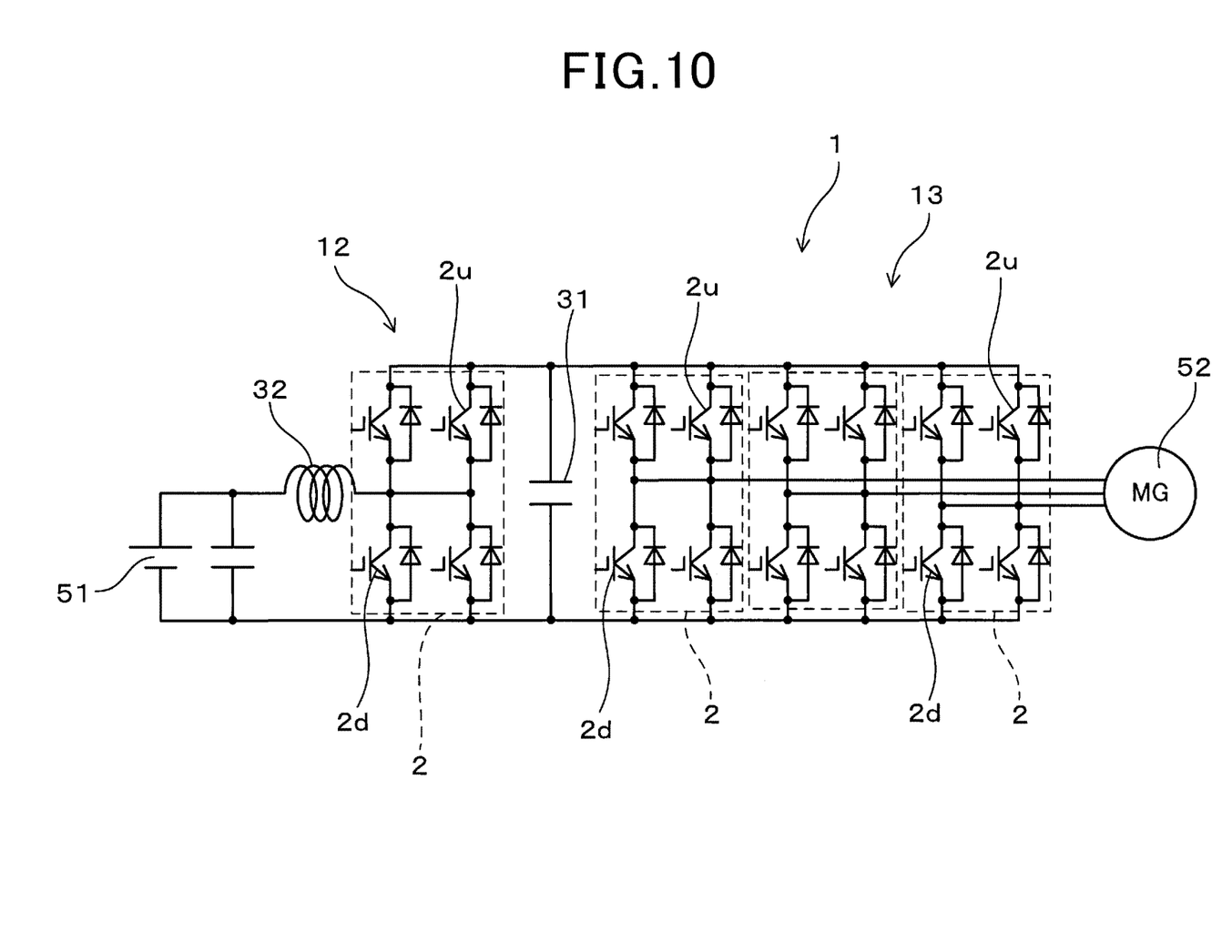
FIG. 10 is a circuit diagram of the power conversion device according to a fifth embodiment.
Figure 11:
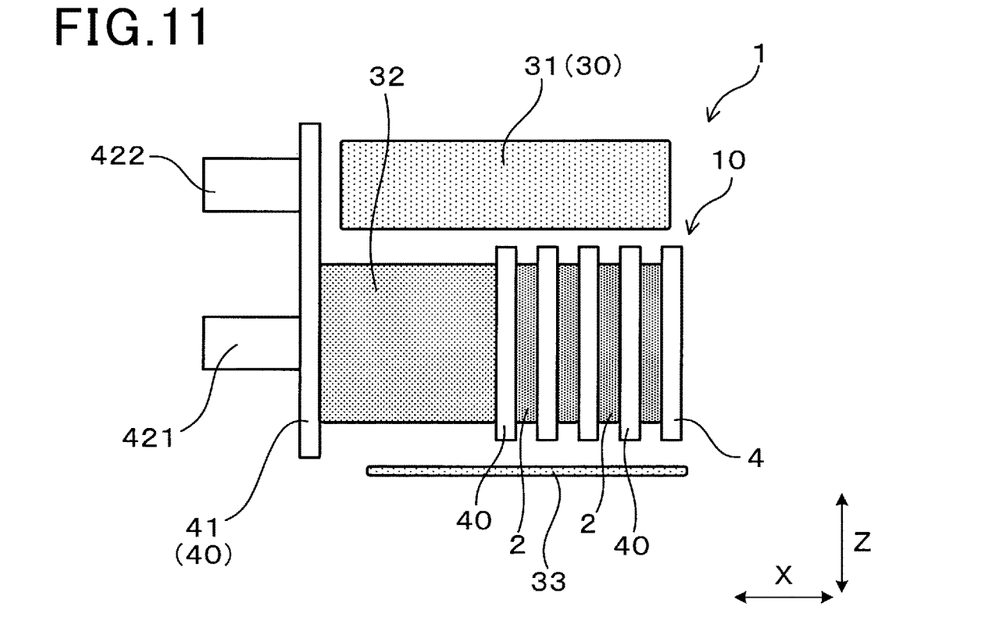
FIG. 11 is a side view of the power conversion device according to the fifth embodiment.
Figure 12:
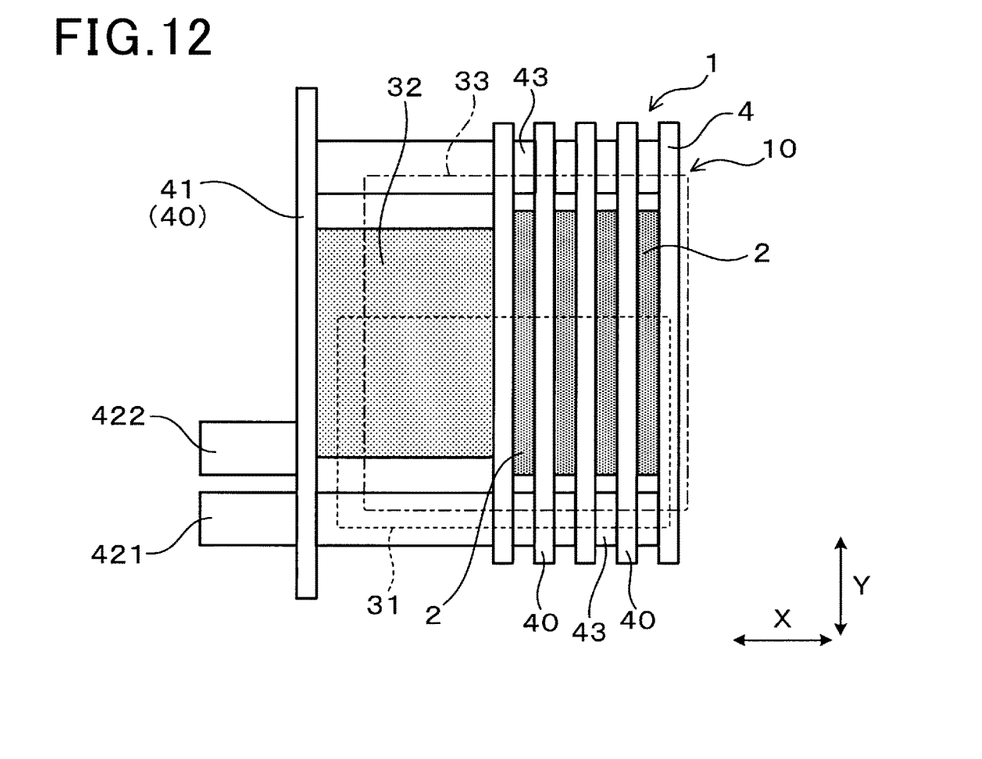
FIG. 12 is a plan view of the power conversion device according to the fifth embodiment.

In the fifth embodiment, as shown in FIGS. 10 to 12, the semiconductor module 2 is integrated with a plurality of upper arm switching elements 2u connected in parallel to each other and a plurality of lower arm switching elements 2d connected in parallel to each other.

In the embodiment, four switching elements of the two upper arm switching elements 2u connected in parallel and the two lower arm switching elements 2d connected in parallel are incorporated into the one semiconductor module 2.

The other configurations are the same as the first embodiment.

In the present embodiment, the number of semiconductor modules 2 can be minimized. Therefore, as shown in FIGS. 11 and 12, the size of the stacking direction X of the laminate 10 can be minimized. Namely, the number of semiconductor modules 2 in the laminate 10 can be reduced by half compared to the case of the first embodiment. Therefore, the dimensions of the stacking direction X of the laminate 10 can be dramatically reduced. As the result, a power conversion device 1 having an even more excellent vibration resistance can be obtained. In addition, the fifth embodiment has the same operational effect as the first embodiment.

Sixth Embodiment

Figure 13:
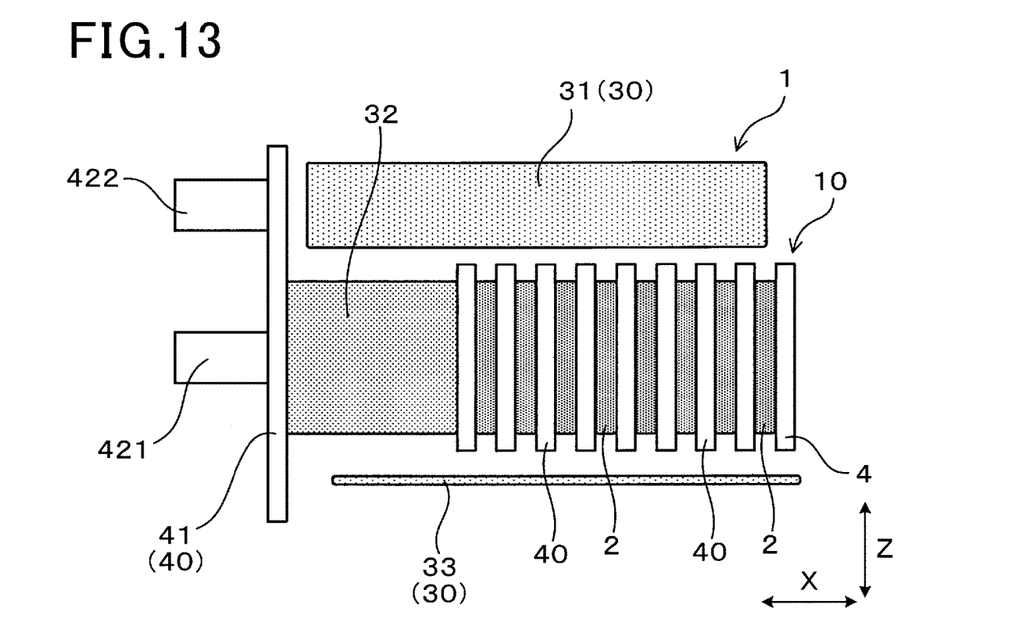
FIG. 13 is a side view of the power conversion device according to a sixth embodiment.

In the sixth embodiment, as shown in FIG. 13, two components were made as the specific arrangement component 30.

Namely, the capacitor 31 and the circuit board 33 are arranged in the specific position as the specific arrangement component 30. In short, in the embodiment, the circuit board 33 is arranged in a position which, when viewed from the stacking direction X, overlaps with the large area cooling plate 41, and, when viewed from the height direction Z, overlaps with the laminate 10.

The other configurations are the same as the first embodiment.

In the case of the present embodiment, the circuit board 33 is the specific arrangement component 30, thus, the cooling of the circuit board 33 can be performed efficiently.

In addition, the sixth embodiment has the same operational effect as the first embodiment.

Seventh Embodiment

Figure 14:
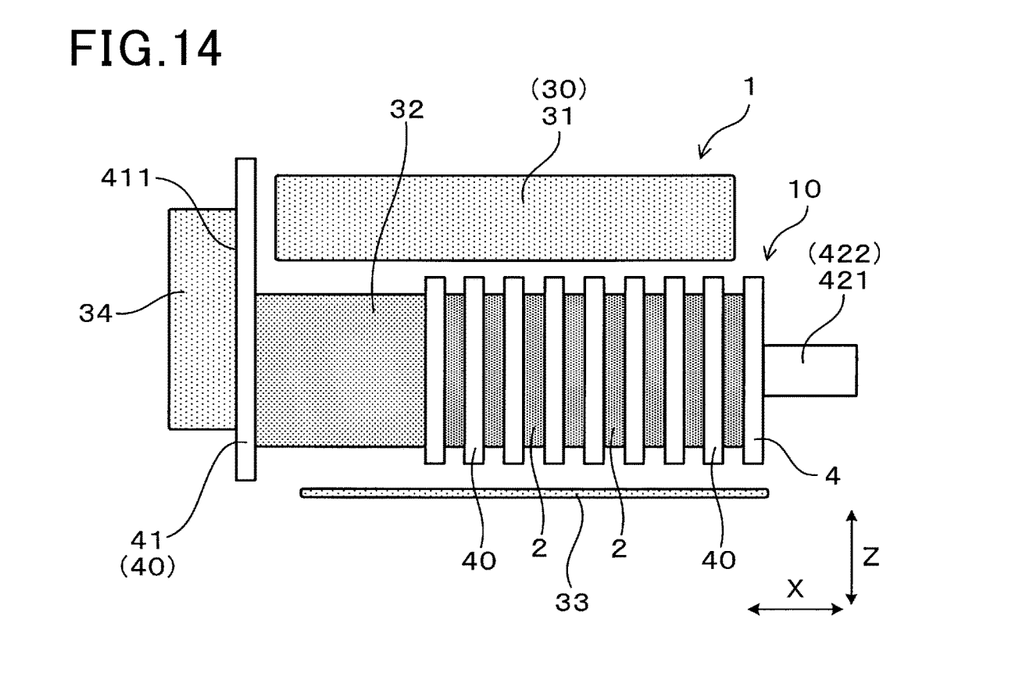
FIG. 14 is a side view of the power conversion device according to a seventh embodiment.
Figure 15:
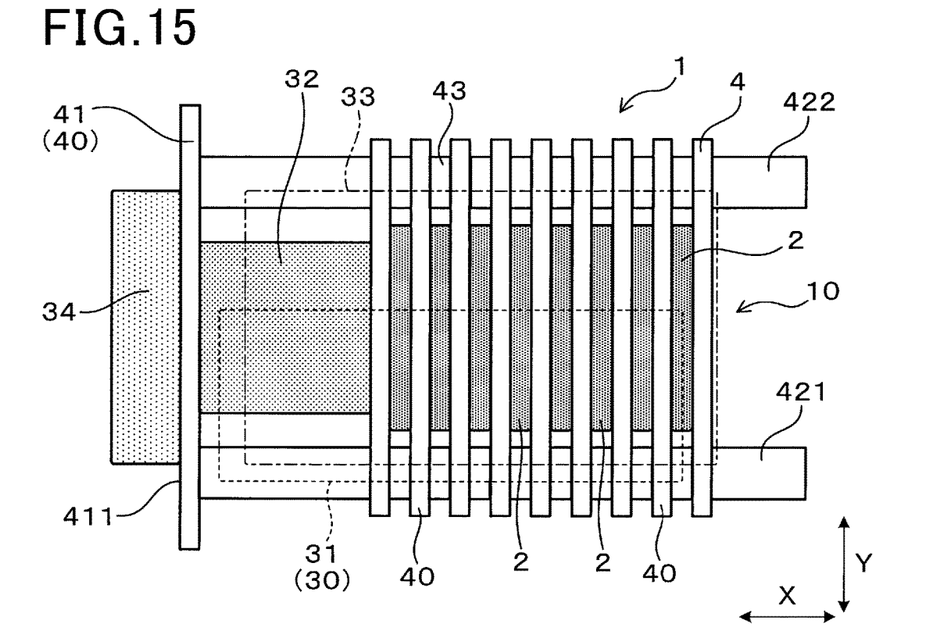
FIG. 15 is a plan view of the power conversion device according to the seventh embodiment.

The seventh embodiment, as shown in FIGS. 14 and 15, is a power conversion device 1 in which the coolant introduction pipe 421 and the coolant discharge pipe 422 are connected to a cooling plate 40 other than the large area cooling plate 41. In the embodiment, the coolant introduction pipe 421 and the coolant discharge pipe 422 are not connected to the large area cooling plate 41. Moreover, the coolant introduction pipe 421 and the coolant discharge pipe 422 are connected to the cooling plate 40 of one end of the stacking direction X opposite to the side on which the large area cooling plate 41 was arranged in the laminated cooler 4. The other configurations are the same as the first embodiment.

In the case of the present embodiment, a component is easily arranged facing the first face 411 which is on a side opposite to the semiconductor module 2 side in the large area cooling plate 41. Namely, for example, as shown in FIGS. 14 and 15, the DC-DC converter 34 can be arranged facing a wide area in the first face 411 of the large area cooling plate 41. Further, it becomes easy to bring the DC-DC converter 34 into surface contact with the large area cooling plate 41. As the result, the cooling of the DC-DC converter 34 can be efficiently performed. In addition, the seventh embodiment has the same operational effect as the first embodiment.

Eighth Embodiment

Figure 16:
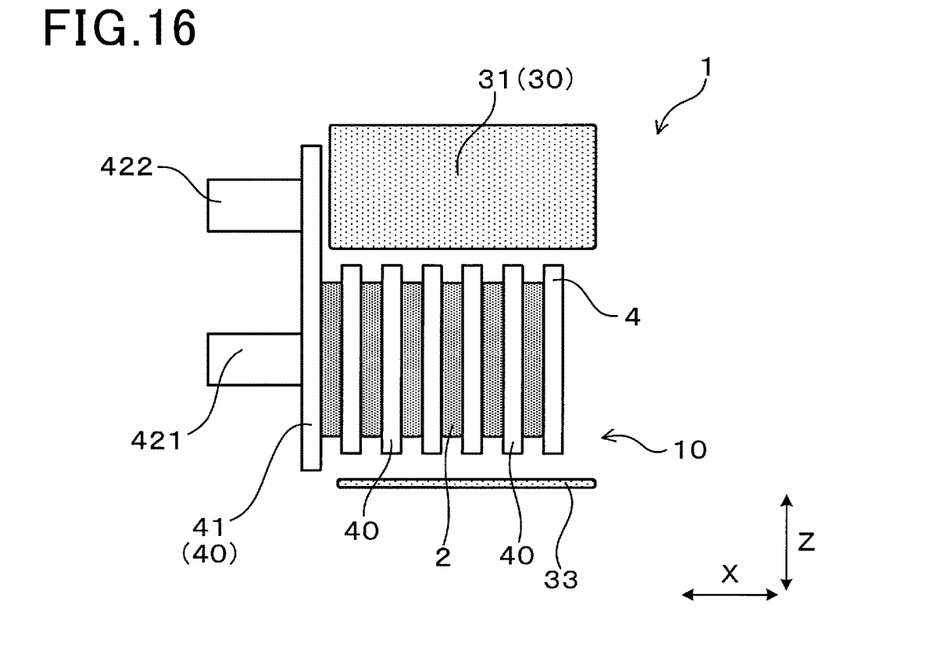
FIG. 16 is a side view of the power conversion device according to an eighth embodiment.

In the eighth embodiment, as shown in FIG. 16, the laminate 10 is constituted by the cooling plate 40 and the semiconductor module 2.

Namely, a component such as the reactor 32 was not laminated in the laminate 10. Moreover, the capacitor 31 is deemed to be the specific arrangement component 30 arranged in the specific position. Only a part of the capacitor 31, when viewed from the stacking direction X, overlaps with the large area cooling plate 41. Further, only a part of the capacitor 31, when viewed from the height direction Z, overlaps with the laminate 10.

The other configurations are the same as the first embodiment. The present embodiment can bring about the same operational effect as in the first embodiment.

Ninth Embodiment

Figure 17:
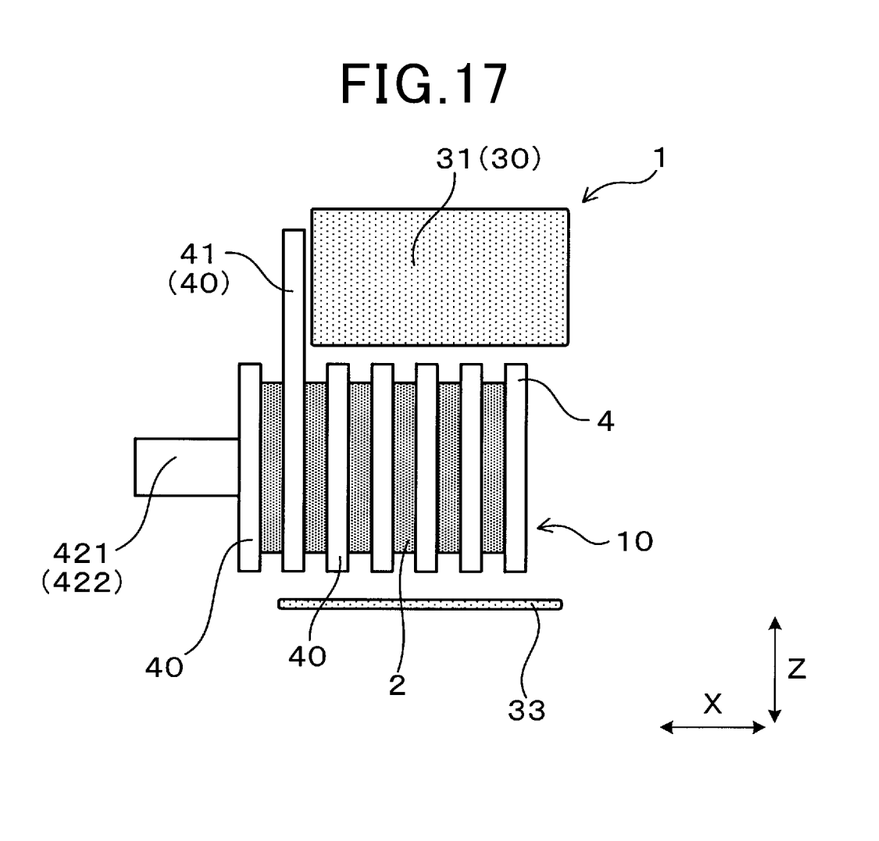
FIG. 17 is a side view of the power conversion device according to a ninth embodiment.

In the ninth embodiment, as shown in FIG. 17, the cooling plate 40 in the laminated cooler 4 other than at either end in the stacking direction X was made as the large area cooling plate 41. The other configurations are the same as the eighth embodiment. The present embodiment can bring about the same operational effect as in the first embodiment.

The present invention is not limited to the aforementioned embodiments, and can be modified accordingly without departing from the scope of the invention. Further, in the aforementioned embodiments, the capacitor or the circuit board was made as the specific arrangement component, but the specific arrangement component is not limited thereto. For example, the DC-DC converter, the reactor and other components may be used as the specific arrangement component.

What is claimed is:

1. A power conversion device comprising
a semiconductor module with switching elements incorporated therein,
a plurality of components electrically connected to the semiconductor module,
a laminated cooler provided with a plurality of cooling plates, and
a laminate constituted by laminating at least the plurality of cooling plates and the semiconductor module, wherein
one among the plurality of cooling plates constituting the laminate is a large area cooling plate in which a projected area when viewed from a stacking direction (X) is larger than that of the other cooling plates, and
at least one of the components is a specific arrangement component which, when viewed from the stacking direction, is arranged in a specific position which overlaps with the large area cooling plate, and, when viewed from a direction orthogonal to the stacking direction, overlaps with the laminate.

2. The power conversion device according to claim 1, wherein the laminate is obtained by laminating at least one of the components other than the specific arrangement component with the cooling plate and the semiconductor module.

3. The power conversion device according to claim 1, wherein the laminate is arranged between two components in a direction orthogonal to the stacking direction, and at least one among the two component is the specific arrangement component.

4. The power conversion device according to claim 3, wherein one of the two components which are arranged to sandwich the laminate in a direction orthogonal to the stacking direction is a circuit board to which a signal terminal of the semiconductor module is connected.

5. The power conversion device according to claim 1, wherein the specific arrangement component is a capacitor.

6. The power conversion device according to claim 1, wherein the large area cooling plate is arranged on an end in the stacking direction among the laminated coolers.

7. The power conversion device according to claim 6, wherein a coolant introduction pipe for introducing a coolant to the laminated cooler, and a coolant discharge pipe for discharging the coolant from the laminated cooler are provided in the large area cooling plate.

8. The power conversion device according to claim 1, wherein the large area cooling plate is in contact with a metal case which houses the semiconductor module, the component and the laminated cooler, and the specific arrangement component is assembled in the case.

9. The power conversion device according to claim 1, wherein the specific arrangement component is in surface contact with the large area cooling plate.

10. The power conversion device according to claim 1, wherein at least one of the respective components is arranged facing both surfaces in the stacking direction in the large area cooling plate.

11. The power conversion device according to claim 1, wherein the semiconductor module is integrated with a plurality of upper arm switching elements connected in parallel to each other, and a plurality of lower arm switching elements connected in parallel to each other.

12. The power conversion device according to claim 1, wherein the large area cooling plate, when viewed from the stacking direction, is obtained by forming the coolant flow path which supplies the coolant to the inside in a portion overlapping with the semiconductor module, and in a portion overlapping with the specific arrangement component.

* * * * *